United States Patent

Kirayoglu et al.

[11] Patent Number: 5,910,231
[45] Date of Patent: Jun. 8, 1999

[54] ARAMID PAPERS OF IMPROVED SOLVENT RESISTANCE AND DIMENSIONALLY STABLE LAMINATES MADE THEREFROM

[75] Inventors: Birol Kirayoglu, Wilmington, Del.; David Jeffrey Powell, Freeport, Me.

[73] Assignee: E. I. du Pont de Nemours and Company, Wilmington, Del.

[21] Appl. No.: 08/898,728

[22] Filed: Jul. 22, 1997

[51] Int. Cl.⁶ .................................................. D21H 13/26

[52] U.S. Cl. ........................ 162/145; 162/138; 162/146; 162/157.3; 162/206; 162/207

[58] Field of Search ................................. 162/146, 157.3, 162/157.1, 157.2, 206, 145, 207, 138, 205

[56] References Cited

U.S. PATENT DOCUMENTS

| | | | |
|---|---|---|---|
| 4,622,265 | 11/1986 | Yoon et al. | 428/364 |
| 5,223,094 | 6/1993 | Kirayoglu et al. | 162/145 |
| 5,314,742 | 5/1994 | Kirayoglu et al. | 428/285 |

FOREIGN PATENT DOCUMENTS

| | | | |
|---|---|---|---|
| 0 178 943 | 10/1985 | European Pat. Off. | D21H 5/20 |
| 0 392 559 | 10/1990 | European Pat. Off. | |
| 49-53995 | 4/1974 | Japan . | |
| WO 92/19804 | 11/1992 | WIPO | D06M 10/00 |

*Primary Examiner*—Peter Chin

[57] ABSTRACT

A process for increasing the solvent resistance of calendered paper consisting of poly(p-phenylene terephthalamide) short fibers and poly(m-phenylene isophthalamide) fibrids and the dimensional stability of laminates made therefrom.

6 Claims, 4 Drawing Sheets

5,910,231

ARAMID PAPERS OF IMPROVED SOLVENT RESISTANCE AND DIMENSIONALLY STABLE LAMINATES MADE THEREFROM

The present invention relates to papers containing aramid floc and fibrids and to a process for improving the solvent resistance of these papers and the dimensional stability of laminants made from these papers.

BACKGROUND OF THE INVENTION

Papers containing aramid floc and fibrids, with or without special ingredients such as quartz fibers, are used as substrates for laminate and composite electronic printed wiring boards. For this end use the paper needs to be strong, easily penetrated by the impregnation resin and resistant to solvents used in the resin impregnation process.

The copper-clad laminates made from such papers need to be dimensionally stable at elevated temperatures for improved performance in the fabrication process for making printed wiring boards.

Aramid papers are generally prepared by a wet process using a paper making machine. Wet-laid sheets are drained, dried and calendered, before they are impregnated with resin. Copper-clad laminates made from these resin impregnated papers may then be converted into printed wiring boards (PWB) for use in electronic applications.

In the process of resin impregnating, the strength of the sheet becomes a critical parameter. Heat treatment processes to improve particular physical properties for aramid molded materials are known. For example, for certain molecular structure aramid polymers, films and molded products made from these polymers, Japanese Patent Application Sho 47(1972)-97740 taught a heat treatment of tens of minutes to days at 180 to 400° C. in air to converted amide to imide bonds.

In the production of aramid papers, Kirayoglu, et al., U.S. Pat. No. 5,223,094 taught a process by which the strength and porosity of aramid papers could be improved, but even with heat treatments such as that taught by Kirayoglu et. al., the solvent resistance of aramid paper was less than desired.

The present invention provides a simple, rapid method not only to improve the solvent resistance of the aramid sheet, but also to improve the dimensional stability of laminates made from these papers.

SUMMARY OF THE INVENTION

The present invention provides a process for increasing the solvent resistance of paper consisting essentially of from 45 to 97 weight % of poly(p-phenylene terephthalamide) short fibers, from 3 to 30 weight % of poly(m-phenylene isophthalamide) fibrids and from 0 to 35 weight % of quartz fiber and increasing the dimensional stability of laminates made from such paper. The process of the present invention comprises heating the paper without the application of pressure at a temperature of from at least 280° C. (536° F.) for at least 20 seconds but not more than 20 seconds at 330° C. (626° F.). Preferred heat treatment conditions, without the application of pressure, for the present invention are heating the paper to a temperature of about 330° C. for about 10 seconds.

Practical benefit of the present invention may be achieved by incorporating the heat treatment of the present invention into the calendering step of papermaking operation. In this case, the process comprising calendering the paper at least a temperature of 300° C. and at least a pressure of 500 pli (89 kg/cm). The preferred conditions for incorporation of the heat treatment of the present invention into the calendering step, is to calender the paper at a temperature of 350° C. and a pressure of 600 pli (107 kg/cm).

DETAILED DESCRIPTION

Figure 1:
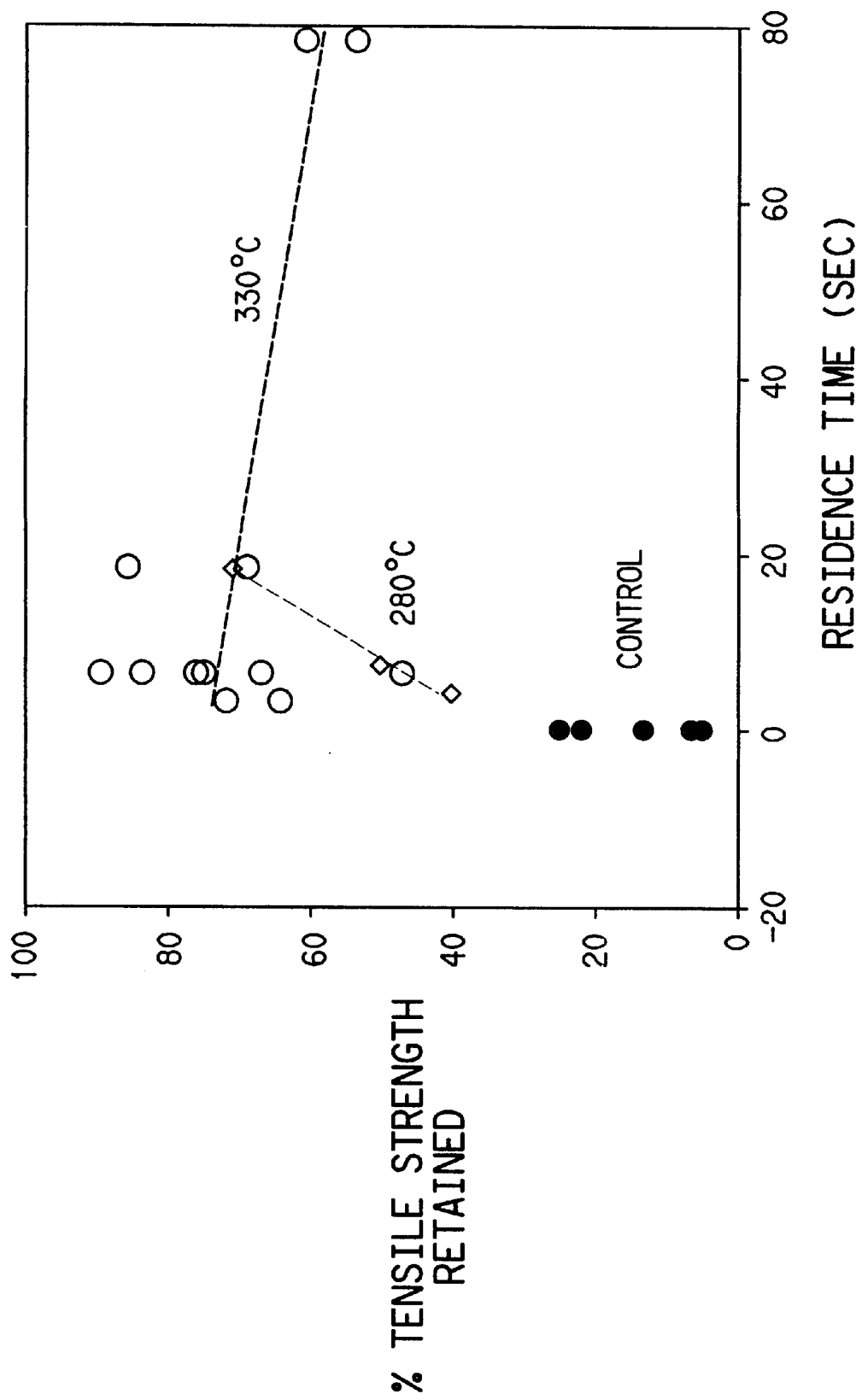
FIG. 1 shows a least squares fit of the solvent resistance expressed as the percent of tensile strength retained after dipping the aramid paper into a solvent as a function of the temperature and time of the heat treatment of the present invention.

In the manufacture of printed wiring boards, aramid papers are first impregnated with resin, producing what are called prepregs. One or multiple layers of these prepregs are laminated. The desired electrical circuitry is photo-imaged using a standard process of: applying photoresist; exposing the photoresist with uv light; chemically developing away the unexposed photoresist; chemically etching the exposed background copper foil; chemically dissolving the photoresist, and treating the etched copper circuitry with an adhesion promoter (oxide treatment).

This resulting photo-imaged laminate is hereafter referred to as an "innerlayer". A number of these innerlayers are then laminated together, using one or more additional prepregs in between the innerlayers, to form a multilayer printed wiring board. Holes are drilled or formed through or partially through the printed wiring board, using mechanical, laser, or plasma technologies, making contact with copper circuitry at pad locations. These holes are then electroplated with copper, or other metals or conductive polymers, to provide electrical connection between various layers of the printed wiring board. The printed wiring board is then finished and the components (integrated circuits) are mounted on it to complete the printed wiring board assembly.

The aramid papers used for printed wiring boards need to be resistant to the solvents in the resin formulation and other processing solvents used in forming composite paper or the laminate. Papers of higher solvent resistance translate into faster production rates in the prepreg process, and higher yields and efficiencies due to reduced strength loss and tearing of the resin saturated papers. Higher resistance to solvents make these papers compatible with essentially all the resin systems being used in the prepreg process for printed wiring board, thus making the use of these papers more universal in this application.

The successful production of multilayer printed wiring boards requires layer-to-layer pad registration and registration of holes to pads. The registration depends strongly on the amount the innerlayers shrink or expand during the printed wiring board fabrication process. A prepreg and laminate with good dimensional stability allows the pad sizes to be smaller on innerlayers while still allowing the holes to line up, making it possible to produce higher density printed wiring boards.

Although there are heat treatment processes known in the art that increase the tensile strength and porosity of the papers, papers treated by these processes still fail to provide high levels of solvent resistance or dimensional stability to the resin impregnated sheets and laminates.

The inventors of the present invention have found that by a simple heat treatment process that both the solvent resistance of the sheet and the dimensional stability of laminates made from this sheet can be increases so that the wet, resin solution saturated sheet retains at least 40% of its dry tensile strength, and the laminate made from this prepreg retains at least 0.02% of its dimensional stability.

Solvents commonly used in the formulation of resin solutions used to impregnate the aramid papers include methyl ethyl ketone (MEK), dimethyl formamide (DMF) and N-methylpyrollidone (NMP). Resins commonly used in the manufacture of prepregs include epoxy, polyimide, and cyanate ester resins.

In the process of the present invention, the aramid paper is heated to a temperature of at least 280° C. (536° F.) for at least 20 seconds, or the papers may be heated to a higher temperature for a shorter time, for example 330° C. for at least 4 seconds. By this process the solvent resistance is increased with a corresponding increase in the dimensional stability of the resin impregnated circuit board product. The preferred heat treatment of the present invention is heating in a temperature range of from 280° C. (536° F.) for at least 20 seconds but not more than 20 seconds at 330° C. (626° F.), and more preferably heating the paper at a temperature of about 330° C. for about 10 seconds.

Figure 3:
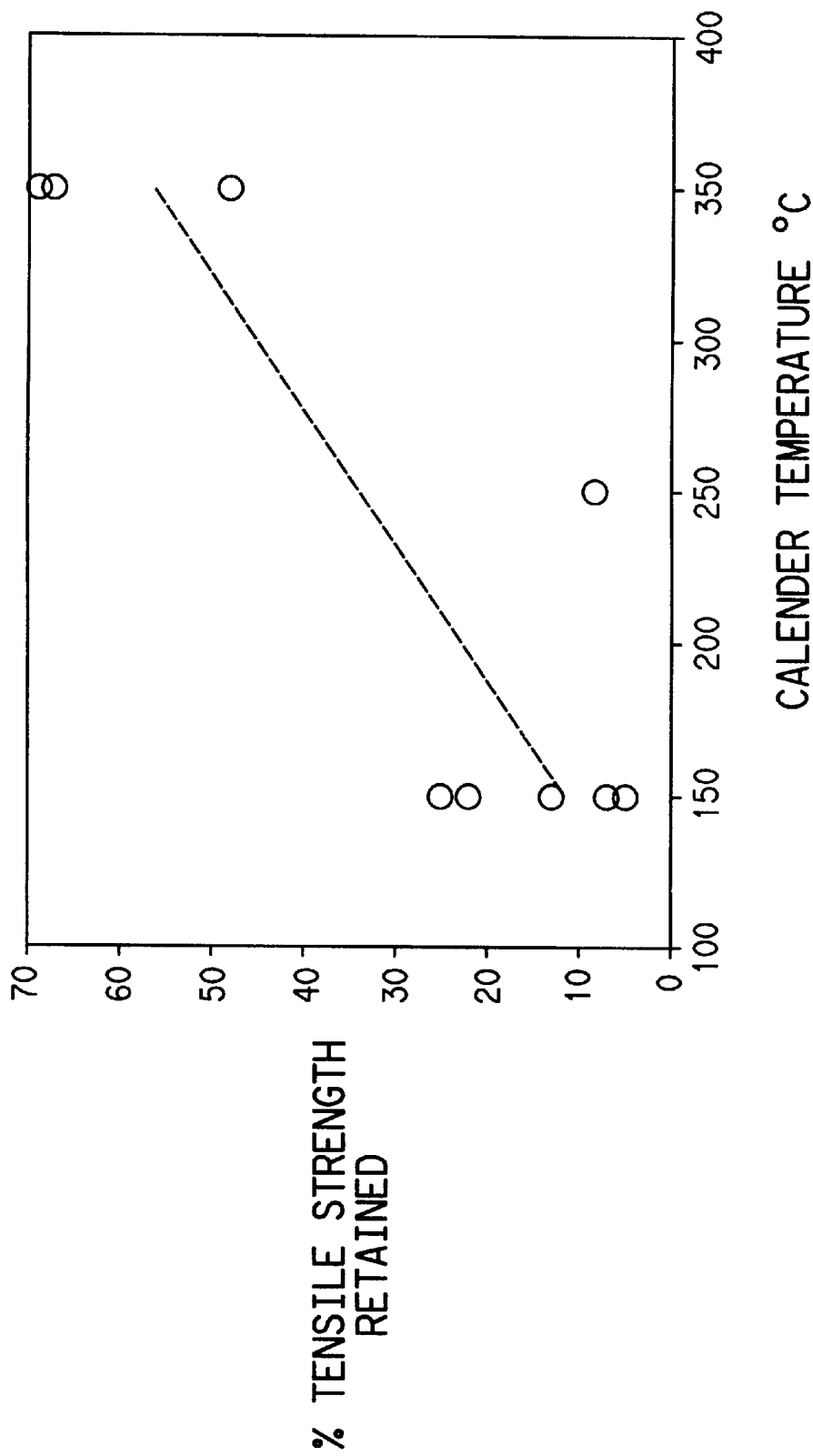
FIG. 3 shows a least squares fit of the solvent resistance as a function of paper calendering temperature.
Figure 4:
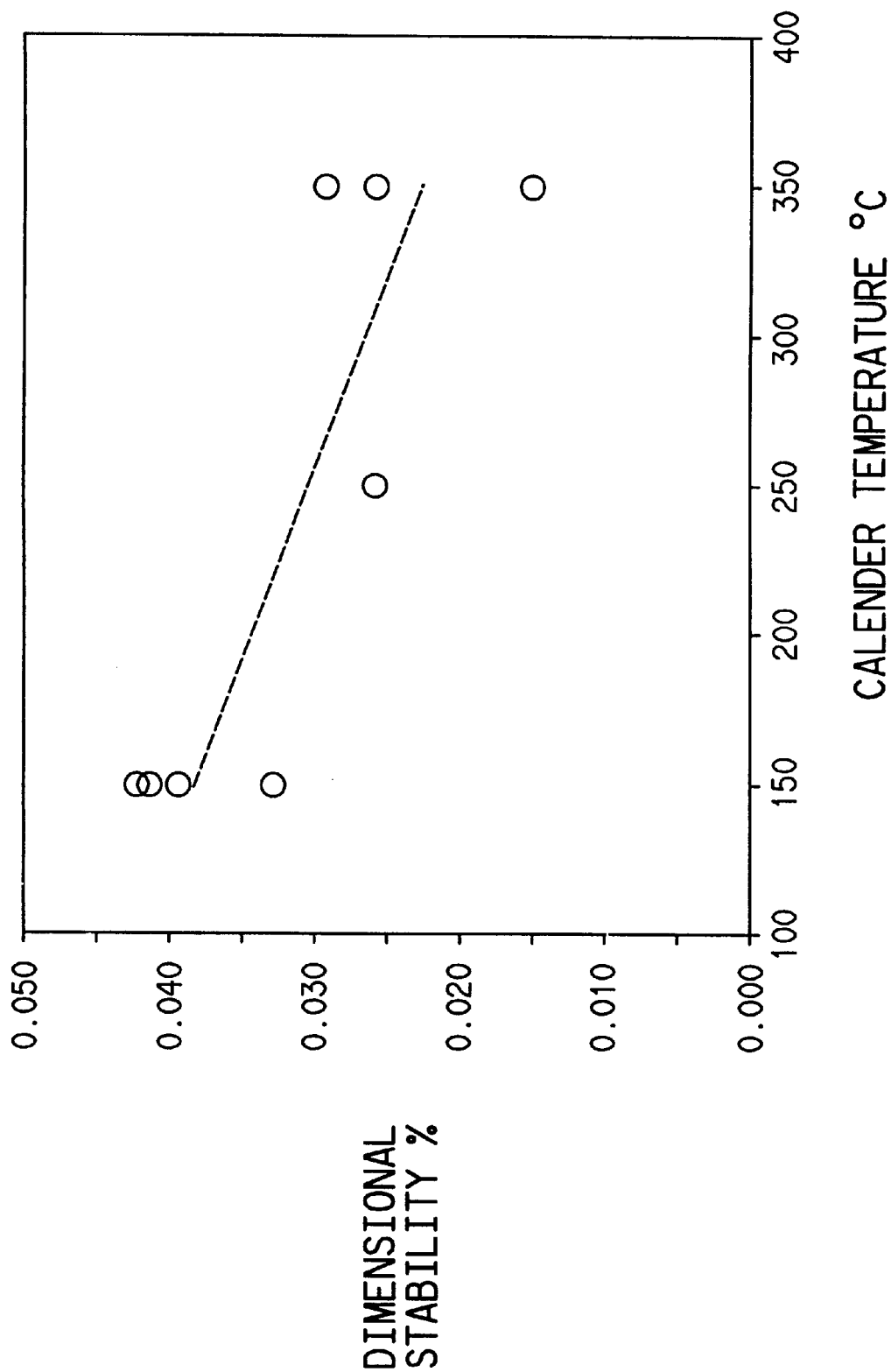
FIG. 4 shows a least squares fit of the dimensional stability as a function of calendering temperature.

What is particularly surprising is that the process maximum results of the heat treatment of the present invention, that is the combination of the highest solvent resistance and the lowest dimensional change cannot be fully accomplished in the calendering step. Yet sufficient improvements in these properties may be realized by incorporating the heat treatment of the present process into the calendering step of the paper making operation by calendering the paper at a temperature of at least 300° C. and at least 500 pli. FIG. 3 show the increases in solvent resistance measured as the percent of paper tensile strength retained after the paper is dipped in a solvent known to be a solvent for the aramid fibrids which make up the sheet. With incorporation of the heat treatment into the calendering step, the solvent resistance can be increased above 40% when calendering temperatures are more than 300° C. FIG. 4 shows the increase in dimensional stability as a function of the calendering temperature. In this case at temperatures above 250° C., the improvement in the dimensional stability is from 0.04% to about 0.03%. Thus, practical benefit of the present invention may be achieved by incorporating the heat treatment of the present invention into the calendering step of papermaking by calendering the paper at a temperature of at least 300° C. and at least a pressure of 500 pli (89 kg/cm). The preferred conditions for incorporation of the heat treatment into the calendering step, is to calender the paper at a temperature of 350° C. and a pressure of 600 pli (107 kg/cm).

Aramid papers of the present invention are formed from a mixture of aramid short fibers (floc) and fibrids. The floc may be composed of para aramid polymer or mixtures of para and meta aramid fibers. Fibrids used in aramid papers are formed from meta-aramid polymer. The concentration of floc and fibrids in the paper may range from 45 to 97% by weight floc and from 3 to 30% by weight fibrids. It is preferred that the para-aramid floc be poly(p-phenylene terephthalamide) and the meta aramid be poly(m-phenylene isophthalamide). Quartz may be used in forming the papers of the present invention and may range from 0 to 35% by weight. All weight % for the paper composition are calculated based on the sheet weight.

In the heating of the paper according to the present invention, the paper may be heated free of applied pressure, or the process of the present invention may be incorporated into calendering. When the process of the present invention is incorporated into the calendering step of the paper making process, the calender must be maintained at a temperature high enough to heat the paper to the required temperatures of the process as is shown in FIGS. 3 and 4.

When the process of the present invention is carried without the application of pressure, the heating is normally accomplished in an oven, where the paper is free from any pressure and is under minimal tension to insure flat, wrinkle free passage of the paper without shrinkage in the cross machine direction (perpendicular to the direction of the paper movement). Typically the process of the present invention may be carried out after the usual calendering step in the paper making process. A typical calender operation in the paper making process is run at temperatures below 120° C., much lower than that required to accomplish the heat treatment of the present invention.

In the case of incorporating the heat treatment into the calendering step, the calender must be maintained at a temperature high enough to heat the paper to the required temperature of the process. In the calendering process, since the paper is under pressure the heat transfer to the sheet from the heated rolls is more efficient, and the heat treatment of the paper can be accomplished at a much lower residence time, e.g, heat treating in an oven requires 4 to 20 seconds of residence time whereas a calender can accomplish the heat treatment in less than one second. The residence time is proportional to the diameter of the calender rolls, since the higher roll diameter corresponds to a higher nip width and available residence time. Calenders with larger diameter rolls can accomplish the heat treatment at a faster speed than calenders with small diameter rolls.

TEST METHODS

Tensile strength was measured according to ASTM Method D-1682-75. Dimensional stability of the laminate was measured according to IPC-TM-650.

The following example is intended as a non-limiting illustration of the present process.

EXAMPLE

This is an example describing the effect of heat treating PPD-T/MPD-I papers, at various temperatures and residence time with and without pressure. Solvent resistance was measured for the papers as described below, and the dimensional stability of prepregs made from these papers was also measured as described below. The papers include variations in the composition.

100% aramid papers composed of PPD-T short fibers and MPD-I fibrids at weight proportions shown below were formed on an inclined wire, wet lay paper machine, and these papers were calendered by passing the sheets between a pair of heated (temperatures and pressure shown below) hard surface steel rolls. Some of these calendered papers in roll form were then heat treated by passing through a heated oven for various periods of residence times. The heat treated papers and controls were tested for tensile strength properties before and after treatment with DMF solvent. These tests were conducted by cutting 10 each 1"×7" long paper strips from each test item. One set (five specimens) from these samples were tested for tensile strength properties using an Instron. The second set was dipped into a 100% DMF solvent for 60 seconds and then the tensile strength of these solvent treated specimens were tested on an Instron within five minute from the time of solvent application. The tensile strength of the solvent treated samples divided by the untreated sample strength defines the solvent resistance of the sample expressed as percent. The solvent resistance of test items are shown below.

To measure the dimensional stability, the papers were prepregged on a standard vertical prepregging tower using epoxy resin having a Tg of approximately 165° C. The 2 ply copper clad laminates were prepared using a vacuum press.

The dimensional stability of these laminates were measured by first placing precise points on four corners of 15"×24" laminate. The relative position of these points were measured on a Confirmer Coordinatograph (X-Y Table). The copper from the surface of the laminates were etched off using ammonium persulfate solution and the laminates then baked at 120° C. for 60 minutes. The relative position of these points was again measured on the Confirmer. The difference between the original measurements and after etch/bake readings is the dimensional stability expressed as percent of length change. The results of dimensional stability measurements are also shown on the table below.

TABLE 1

| TEST ITEM | BASIS WT. (oz/yd) | FLOC/FIBRID RATIO % | CALENDERING TEMP ° C. | PRESS pli | TIME sec | HEAT TREATMENT TEMP ° C. | TIME sec |
|---|---|---|---|---|---|---|---|
| A-I-1 | 1.6 | 87/13 | 150 | 4950 | 0.028 | — | — |
| A-I-2 | " | " | " | " | " | — | — |
| A-I-3 | " | " | " | " | " | — | — |
| A-II-1 | " | " | " | " | " | 330 | 3.8 |
| A-II-2 | " | " | " | " | " | " | " |
| A-III-1 | " | " | " | " | " | 330 | 6.4 |
| A-III-2 | " | " | " | " | " | " | " |
| A-III-3 | " | " | " | " | " | " | " |
| A-III-4 | " | " | " | " | " | " | " |
| A-III-5 | " | " | " | " | " | " | " |
| A-III-6 | " | " | " | " | " | " | " |
| A-IV-1 | " | " | " | " | " | 330 | 19.0 |
| A-IV-2 | " | " | " | " | " | " | " |
| A-V-1 | " | " | " | " | " | 330 | 78.0 |
| A-V-2 | " | " | " | " | " | " | " |
| B-I-1 | 2.0 | 90/10 | 150 | 4950 | 0.028 | — | — |
| C-I-1 | " | 93/7 | 150 | 4950 | 0.028 | — | — |
| D-I-1 | " | 90/10 | 250 | 1678 | 0.030 | — | — |
| E-I-1 | 1.6 | 87/13 | 350 | 603 | 0.013 | — | — |
| E-I-2 | " | " | " | " | " | — | — |
| E-I-3 | " | " | " | " | " | — | — |
| B-IV-1 | 2.0 | 90/10 | 150 | 4950 | 0.028 | 350 | 19.0 |
| C-IV-1 | " | 93/7 | " | " | " | " | " |
| D-IV-1 | " | 90/10 | " | " | " | " | " |
| F-II-1 | 1.6 | 87/13 | 150 | 4950 | 0.028 | 280 | 3.8 |
| F-III-1 | " | " | " | " | " | " | 6.4 |
| F-IV-1 | " | " | " | " | " | " | 19.0 |

TABLE 2

| TEST ITEM | TENSILE STRENGTH AS-IS (lb/in) | AFTER DMF (lb/in) | SOLVENT RESISTANCE (%) | DIMENSIONAL STABILITY MD (%) | XD (%) | AVE (%) |
|---|---|---|---|---|---|---|
| A-I-1 | 8.9 | 2.0 | 22.0 | .040 | .044 | .042 |
| A-I-2 | 8.8 | 2.2 | 25.0 | .036 | .042 | .039 |
| A-I-3 | 7.6 | 1.0 | 13.0 | .074 | .004 | .039 |
| A-II-1 | 7.8 | 5.0 | 64.0 | .015 | .025 | .020 |
| A-II-2 | 10.6 | 7.6 | 71.0 | .014 | .032 | .023 |
| A-III-1 | 7.1 | 4.8 | 67.0 | .009 | .009 | .009 |
| A-III-2 | 9.4 | 4.4 | 47.0 | .015 | .024 | .020 |
| A-III-3 | 7.3 | 5.5 | 75.0 | .023 | .013 | .018 |
| A-III-4 | 11.8 | 10.5 | 89.0 | .011 | .005 | .008 |
| A-III-5 | 8.6 | 6.5 | 76.0 | .023 | .020 | .022 |
| A-III-6 | 11.8 | 9.8 | 83.0 | .029 | .030 | .030 |
| A-IV-1 | 9.7 | 8.2 | 86.0 | .013 | .013 | .013 |
| A-IV-2 | 9.7 | 6.7 | 69.0 | .004 | .014 | .009 |
| A-V-1 | 13.1 | 7.9 | 60.3 | — | — | — |
| A-V-2 | 10.6 | 5.6 | 52.8 | — | — | — |
| B-I-1 | 10.3 | 0.5 | 5.0 | .036 | .029 | .033 |
| C-I-1 | 6.3 | 0.4 | 6.8 | .032 | .049 | .041 |
| D-I-1 | 12.4 | 1.0 | 8.1 | .016 | .035 | .026 |
| E-I-1 | 19.2 | 9.2 | 48.0 | .011 | .040 | .026 |

TABLE 2-continued

| TEST ITEM | TENSILE STRENGTH | | SOLVENT RESISTANCE (%) | DIMENSIONAL STABILITY | | |
|---|---|---|---|---|---|---|
| | AS-IS (lb/in) | AFTER DMF | | MD (%) | XD (%) | AVE (%) |
| E-I-2 | 16.2 | 10.8 | 67.0 | .026 | .031 | .029 |
| E-I-3 | 16.6 | 11.4 | 69.0 | .020 | .009 | .015 |
| B-IV-1 | 21.7 | 13.9 | 64.0 | .016 | .017 | .017 |
| C-IV-1 | 10.8 | 6.5 | 60.2 | −.004 | −.007 | −.006 |
| D-IV-1 | 24.7 | 16.9 | 68.4 | −.030 | .003 | +/−.017 |
| F-II-1 | 11.4 | 4.6 | 40.0 | .019 | .026 | .023 |
| F-III-1 | 8.2 | 4.1 | 50.0 | .026 | .031 | .029 |
| F-IV-1 | 8.6 | 6.1 | 71.0 | .020 | .009 | .015 |

Figure 2:
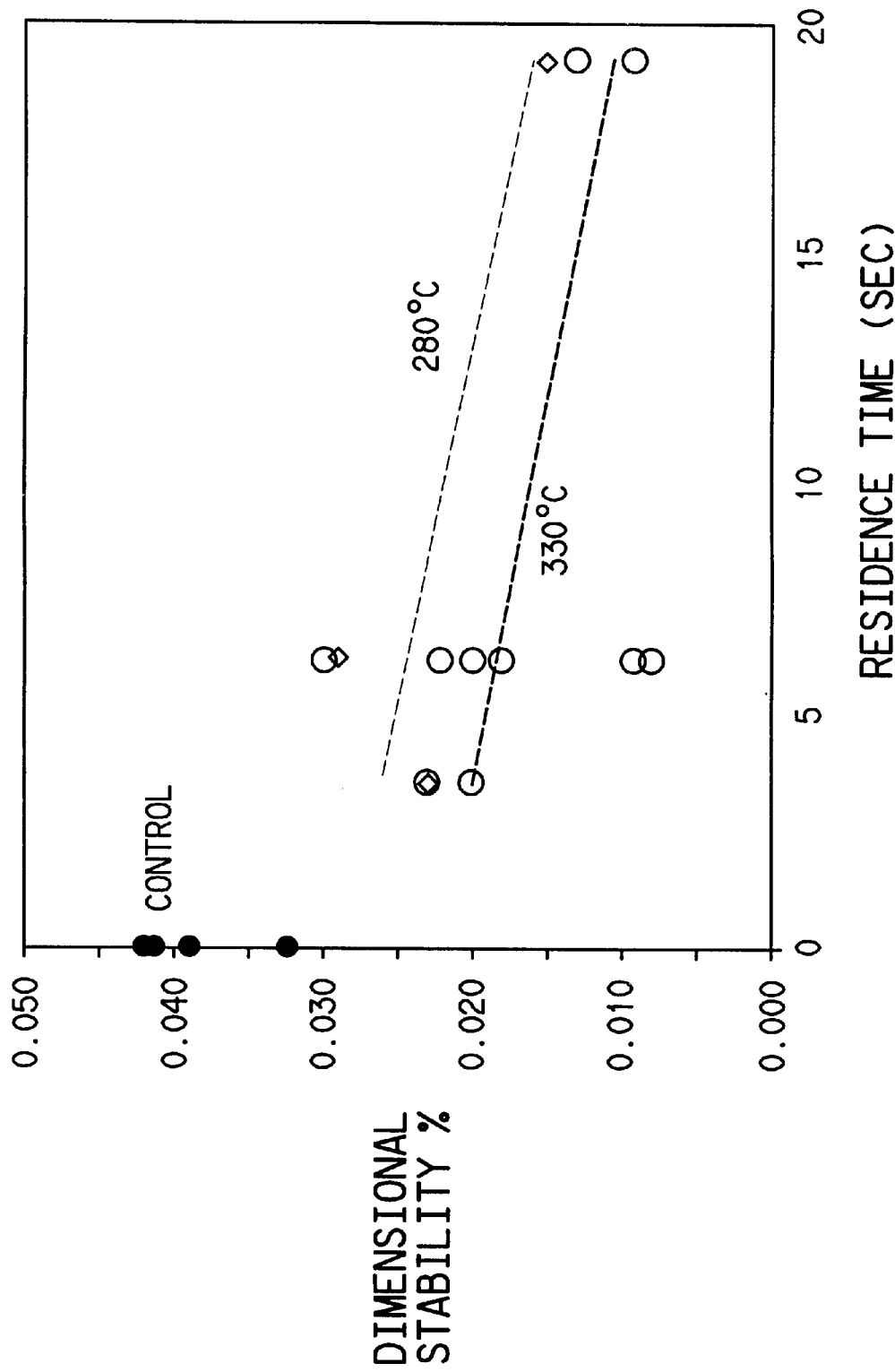
FIG. 2 shows a least squares fit of the percent of dimensional stability as a function of the temperature and time of the heat treatment of the present invention.

Comparison of items A-I, A-II, A-III, A-IV, A-V, F-II, F-III and F-IV on Table 1, show that heat treating these papers in 330° C. oven for at least 4 seconds result in solvent resistant paper which retains at least 50% of its original tensile strength. At 280° C. to attain the same strength level the residence time has to be at least 10 seconds, see FIG. 1. The same heat treatment at 330° C. for at least 4 seconds results in laminate dimensional stability of 0.020%, while at 280° C. the residence time required to yield a dimensional stability of 0.020% goes up to 13 seconds, see FIG. 2. These properties are significantly better than the controls, which can only achieve solvent resistance of <20% and dimensional stability of >0.035%.

Comparison of items A-I, B-1, C-1, D-1 and E-I, in Table, show calendering at 330° C., at very low residence times (<0.1 seconds), result in a solvent resistant product, which maintains at least 40% of its original tensile strength after treatment with 100% DMF solvent, see FIG. 3. Laminates made from these papers provide a dimensional stability of at least 0.025%, see FIG. 4. Calendering temperatures of 250° C. or less result in much lower solvent resistance and dimensional stability performance.

What is claimed is:

1. A process for increasing the solvent resistance of aramid paper consisting essentially of from 45 to 97 weight % of poly(p-phenylene terephthalamide) short fibers, from 3 to 30 weight % of poly(m-phenylene isophthalamide) fibrids and from 0 to 35 weight % of quartz fiber and increasing the dimensional stability of laminates made from such paper, the process comprising heating the paper without the application of pressure at a temperature of from at least 280° C. (536° F.) for at least 20 seconds but not more than 20 seconds at 330° C. (626° F.).

2. The process of claim 1 wherein the paper consists essentially of from 70 to 97% by weight short poly(p-phenylene terephthalamide) fibers and 3 to 30% by weight poly(m-phenylene isophthalamide) fibrids.

3. The process of claim 1 wherein the paper is heated at about 330° C. for about 10 seconds.

4. A process for increasing the solvent resistance of aramid paper consisting essentially of from 45 to 97 weight % of poly(p-phenylene terephthalamide) short fibers, from 3 to 30 weight % of poly(m-phenylene isophthalamide) fibrids and from 0 to 35 weight % of quartz fiber and increasing the dimensional stability of laminates made from such paper, the process comprising calendering the paper at least a temperature of 300° C. and at least a pressure of 500 pli (89 kg/cm).

5. The process of claim 4 wherein the paper is calendered at 350° C. and at a pressure of 600 pli (107 kg/cm).

6. The process of claim 4 wherein the paper consists essentially of from 70 to 97% by weight short poly(p-phenylene terephthalamide) fibers and 3 to 30% by weight poly(m-phenylene isophthalamide) fibrids.

* * * * *